US009013174B2

(12) United States Patent
Loy et al.

(10) Patent No.: US 9,013,174 B2
(45) Date of Patent: Apr. 21, 2015

(54) MOTORIZED ELECTRICAL SWITCH MECHANISM

(75) Inventors: Garry M. Loy, Raleigh, NC (US); Rodney C. Hemminger, Raleigh, NC (US)

(73) Assignee: Elster Solutions, LLC, Raleigh, NC (US)

( * ) Notice: Subject to any disclaimer, the term of this patent is extended or adjusted under 35 U.S.C. 154(b) by 391 days.

(21) Appl. No.: 13/451,752

(22) Filed: Apr. 20, 2012

(65) Prior Publication Data

US 2013/0278245 A1 Oct. 24, 2013

(51) Int. Cl.
*G01R 11/02* (2006.01)
*H01H 3/40* (2006.01)

(52) U.S. Cl.
CPC .................................... *H01H 3/40* (2013.01)

(58) Field of Classification Search
None
See application file for complete search history.

(56) References Cited

U.S. PATENT DOCUMENTS 4,352,979 A * 10/1982 Knecht ..................... 235/91 A
6,765,157 B2 * 7/2004 Rademacher et al. ........ 200/1 R

* cited by examiner

*Primary Examiner* — Paresh Patel
(74) *Attorney, Agent, or Firm* — Baker & Hostetler LLP

(57) ABSTRACT

A bistable relay may include a pair of contact arms. Each contact arm is configured to have a first end and a second end, such that, when the relay is in the closed position, current flows from the first end to the second ends of each of the contact arms, and when the relay is in an open position, current does not flow from the first ends to the second ends of the contact arms. The relay further includes a motor, a pair of springs, a pair of cams driven by the motor, and a linearly actuating member configured to move the contact arms from the first configuration to the second configuration, the member including a cam follower surface.

18 Claims, 20 Drawing Sheets

MOTORIZED ELECTRICAL SWITCH MECHANISM

TECHNICAL FIELD

The present invention relates to relays or electrical switches.

BACKGROUND

State of the art operating mechanisms for small to medium electrical switch contacts use an electromagnet to generate the operating force. The electromagnet is usually a solenoid with a plunger that generates a linear output force. Alternatively, a rotary mechanism without a plunger has been employed. Permanent magnets have also been used to hold contacts in either the closed or opened positions. While electromagnetically driven mechanisms operate the contacts quickly, the size, required operating power, and the electromagnet needed to overcome the magnetic force of permanent magnet latching designs are disadvantageous. Scotch yoke mechanisms may also be used in conjunction with a DC motor. However, this type of design is limited by motor speed.

SUMMARY

An electrical relay, such as a bistable relay, may include one or more pairs of electrical contacts arms. An operating mechanism may control the positioning of these contact arms such that the electrical relay is configured to have two positions. These two positions include a closed position in which electrical current may flow through the contact arms and an open position in which electrical current does not flow through the contact arms. Each contact arm is configured to have a first end and a second end, such that, when the relay is in the closed position, current flows from the first end to the second ends of each of the contacts, and when the relay is in an open position, current does not flow from the first ends to the second ends of the contacts. The relay further includes a motor, a pair of springs, a pair of cams driven by the motor, and a linearly actuating member connected to the moving current conductor and configured to move the contacts from the first configuration to the second configuration, the member including a cam follower surface.

In alternative embodiments, an electrical relay may include a pair of contact arms, a fixed terminal, and at least one pair of electrical contacts. Each contact arm is configured to have a first end and a second end, such that, when the relay is in the closed position, current flows from the first end to the second ends of each of the contacts, and when the relay is in an open position, current does not flow from the first ends to the second ends of the contacts. The relay further includes, a motor, at least one spring, at least one cam driven by the motor, and a linearly actuating member connected to the contacts and configured to move the contacts from the first configuration to the second configuration, the member including a cam follower surface.

Other embodiments may include a watt hour meter, such as a single phase or polyphase watt hour meter. The watt hour meter may include a meter current sensor, a plurality of meter terminals, including a first set of meter terminals and a second set of meter terminals, and a bistable electrical relay having a closed configuration and an opened configuration. The bistable relay may further include a pair of contacts, each having a first position associated with the closed operation of the relay and a second position associated with the open operation of the relay. The bistable relay may have a motor, a pair of springs, a pair of cams driven by the motor, and a linearly actuating member connected to the contacts and configured to move the contacts from the first position to the second position and from the second position to the first position, the member including a cam follower surface.

Additionally, a method of controlling the flow of current through an electrical relay may include a step of actuating a motor so as to effect rotation of a pair of cams and an increase in potential energy of two springs attached to the cams, wherein the springs are both attached to a cam follower surface resting between the cams, the cam follower surface being attached to a linear actuating member that controls the motion of a pair of contacts. The method may further include stopping the motor when the cam follower surface shifts from a first position to a second position, such that when the cam follower surface is in the first position, current flows through the relay and when the cam follower surface is in a second position, current does not flow through the relay.

BRIEF DESCRIPTION OF THE DRAWINGS

The foregoing summary, as well as the following detailed description, are better understood when read in conjunction with the appended drawings in which exemplary, non-limiting embodiments are illustrated. In the drawings.

DETAILED DESCRIPTION OF ILLUSTRATIVE EMBODIMENTS

FIGS. 1-11 illustrate various embodiments of an electrical relay or switch and associated methods for regulating current flow. Relays for various types of applications are contemplated.

Figure 1:
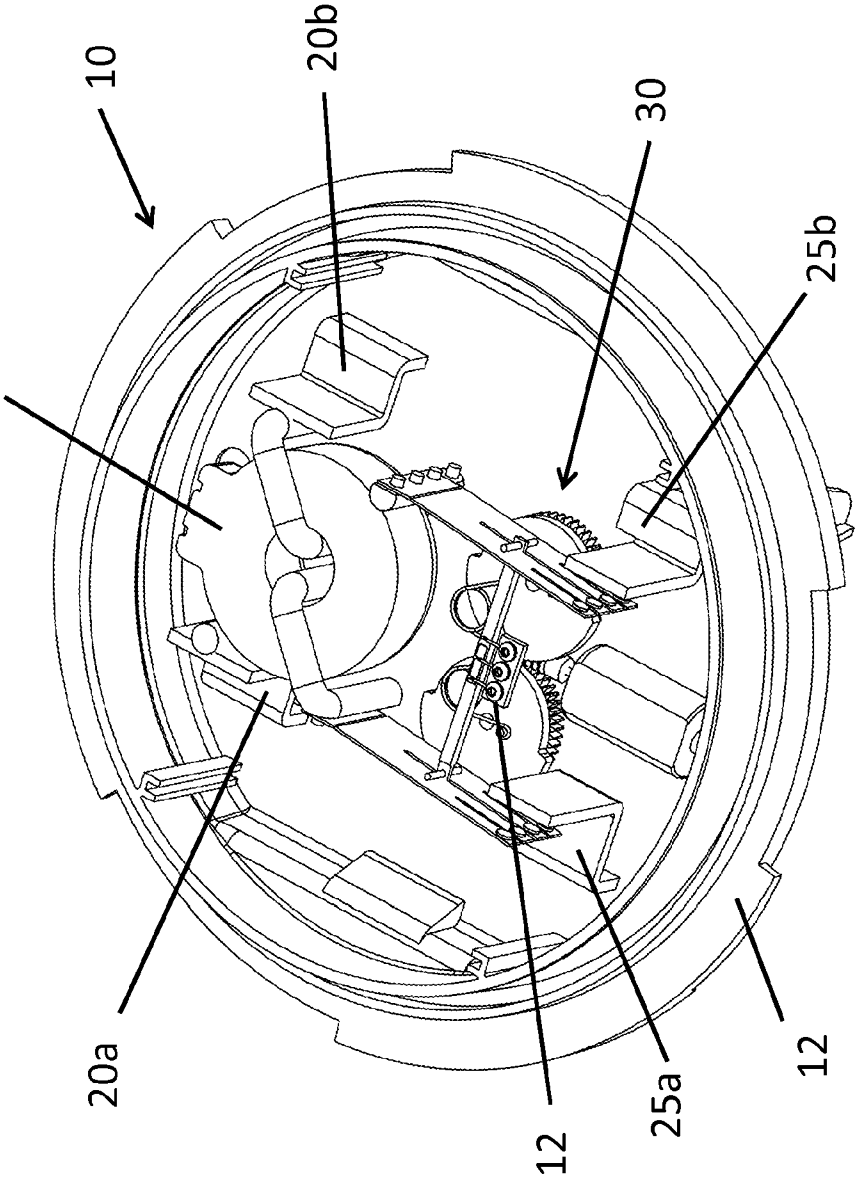
FIG. 1 is a top perspective view of a base of an exemplary embodiment of a single phase watt hour meter with its cover (not shown) removed.
Figure 2:
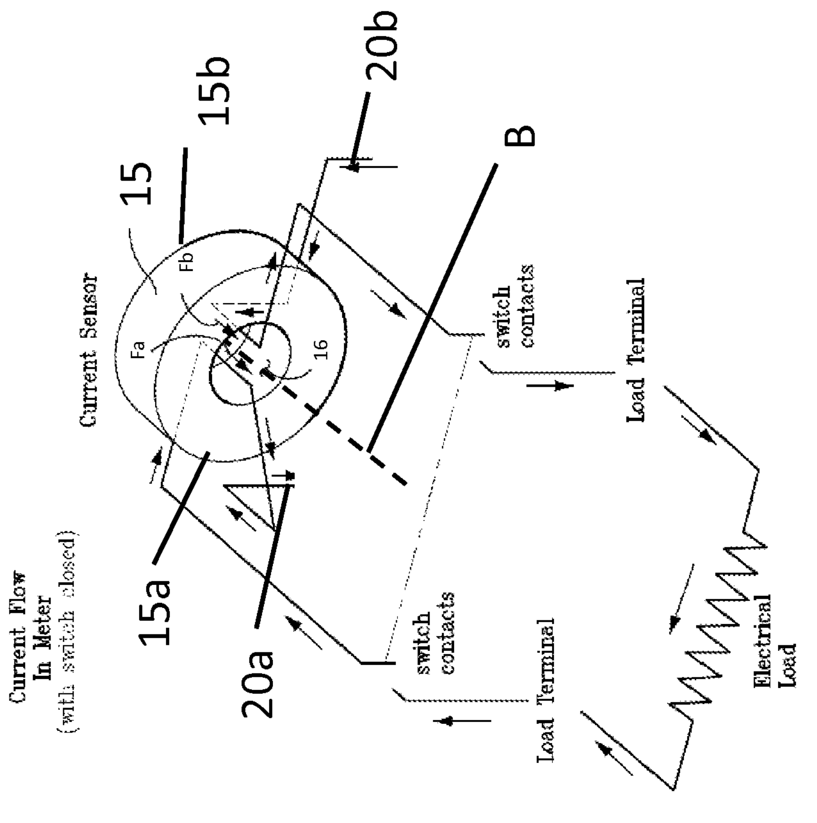
FIG. 2 is a schematic diagram illustrating current flow in the embodiment of the single phase watt hour meter shown in FIG. 1.
Figure 3:
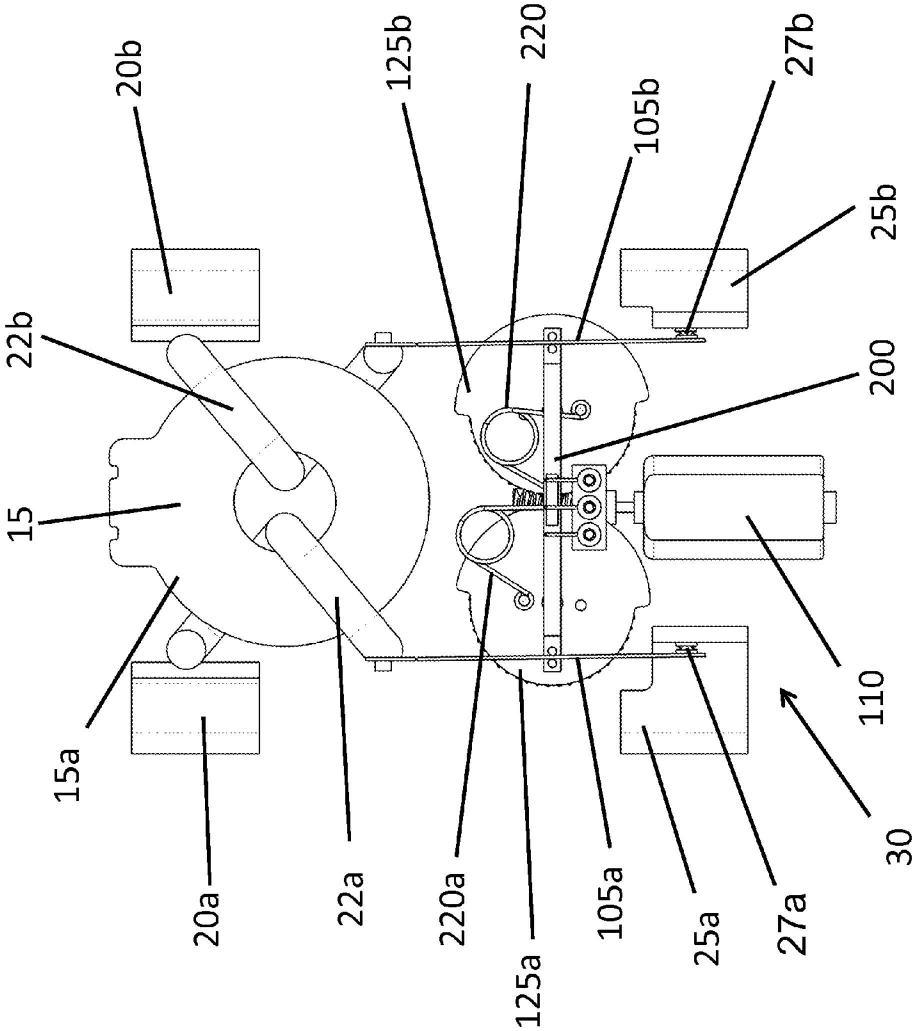
FIG. 3 is a top planar view of the embodiment of the single phase watt hour meter shown in FIGS. 1 and 2 with a switch in the closed position with portions cut away.

In particular, FIG. 1 shows an embodiment of a watt hour meter, such as a single phase watt hour meter 10. In the embodiment shown, the meter 10 comprises a single current sensor 15, line terminals 20*a,b* and load terminals 25*a,b*, and a switch or electrical relay 30. As shown in the schematic in FIG. 2, the current sensor 15 may comprise a toroidal coil (not shown) and a bore 16, wherein the bore 16 may connect a top side 15*a* and a bottom side 15*b* of the sensor 15 and has a center axis B. The current sensor 15 may be configured to measure the flow of current through the meter 10 when the relay 30 is closed so as to permit current flow. Specifically, as shown in FIG. 3, line terminal 20*a* is attached to a conductor 22*a* which enables the flow of current through the bore 16 of the current sensor 15 in a direction F. Direction Fa is parallel to the center axis B of the bore going from bottom side 15*b* to top side 15*a* of the sensor 15. Line terminal 20*b* is attached to a conductor 22*b* which enables the flow of current through the bore 16 in direction Fb which is parallel to center axis B and direction Fa and also goes from the bottom side 15*b* to the top side 15*a* of the sensor 15.

Figure 4:
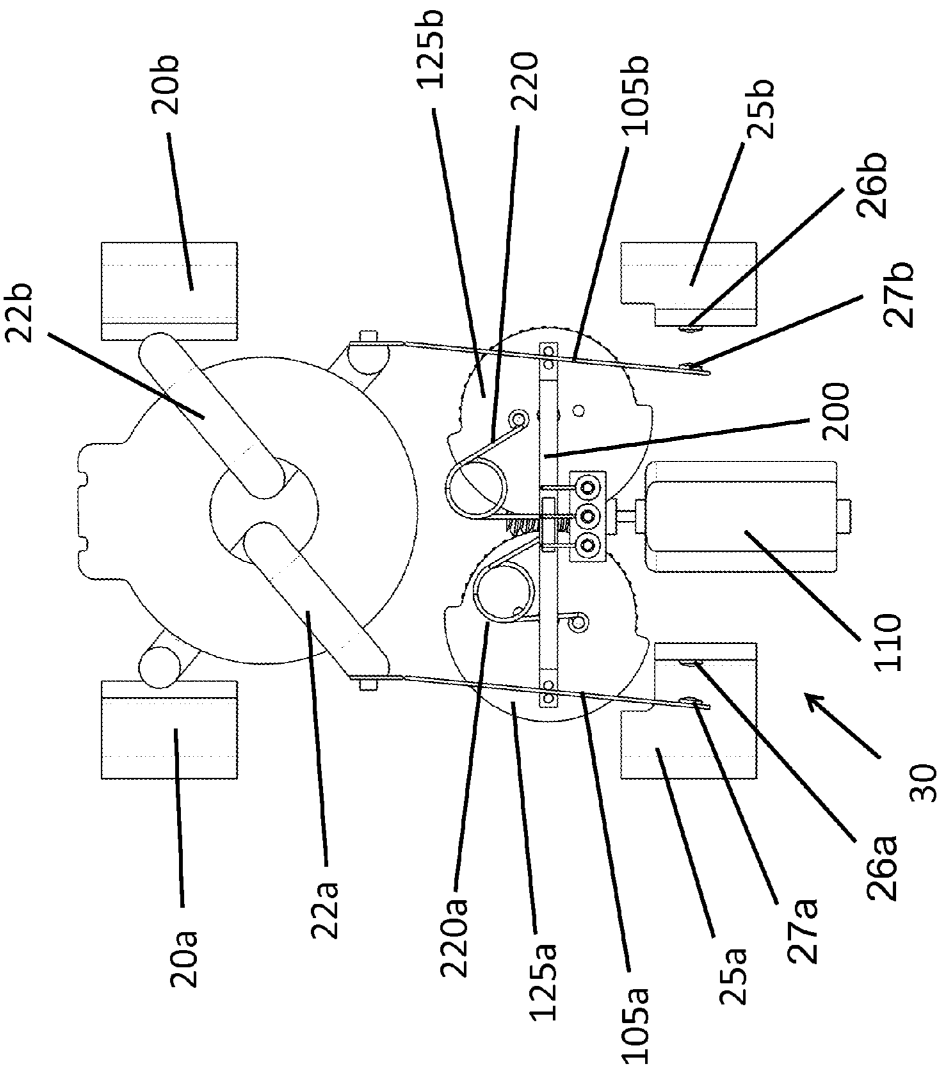
FIG. 4 is a top planar view of the embodiment of the single phase watt hour meter shown in FIGS. 1-3 with the switch in the opened position with portions cut away.

FIGS. 3 and 4 are top planar views of the meter 10 shown with the relay 30 in the closed and opened positions, respectively. A three dimensional coordinate system is used to describe the positions and orientations of the parts of the relay. The coordinate system includes a longitudinal direction L, a lateral direction A, and a transverse direction T, wherein each of the directions is perpendicular to both of the other two directions. As shown in FIGS. 3 and 4, conductors 22*a,b* may each be attached to contact arms 105*a,b*, respectively of the relay 30. The contact arms 105*a,b* may conduct the flow of electrical current to movable switch contacts 27*a,b* which may be mounted on fingers 108*a,b* of the contact arms 105*a, b*, respectively. The movable switch contacts 27*a,b* may be configured to align with corresponding fixed switch contacts 26*a,b*. In the closed position (FIG. 3), contact arms 105*a,b* may be oriented longitudinally parallel to the lateral axis A so that the movable switch contacts 27*a,b* are positioned to touch the fixed switch contacts 26*a,b* of the load side terminals 25*a,b*, respectively. In the opened position (FIG. 4), the contact arms 105*a,b* may be oriented longitudinally askew to lateral axis A so that they are positioned far enough apart from the load side terminals 25*a,b* that current does not flow or arc between the contacts and the load side terminals. In an alternative embodiment, one or more pairs of contacts 26*a,b*, 27*a,b* may be used with a corresponding number of fingers 108*a,b* on the moving contact arms 105*a,b*.

Figure 5:
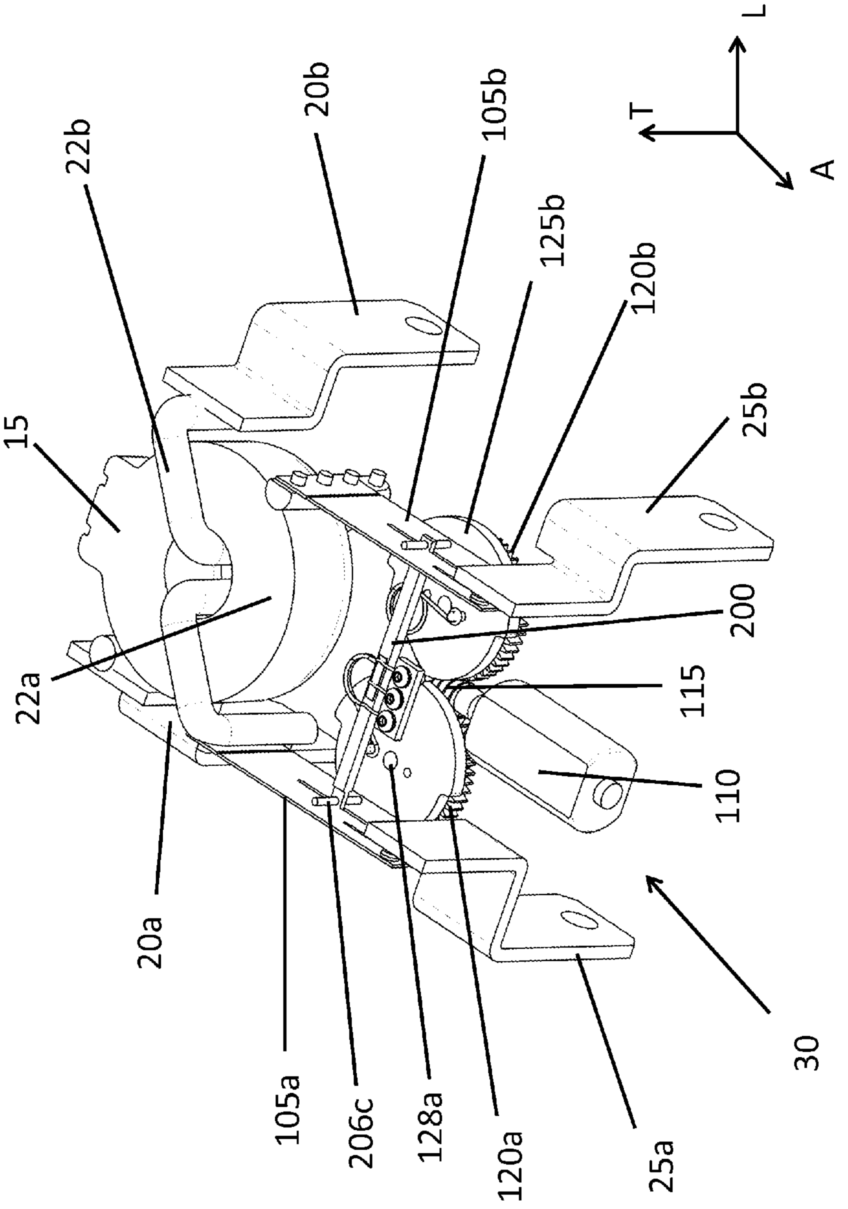
FIG. 5 is a front perspective view of the embodiment of the single phase watt hour meter shown in FIGS. 1-4 with portions cut away.
Figure 6:
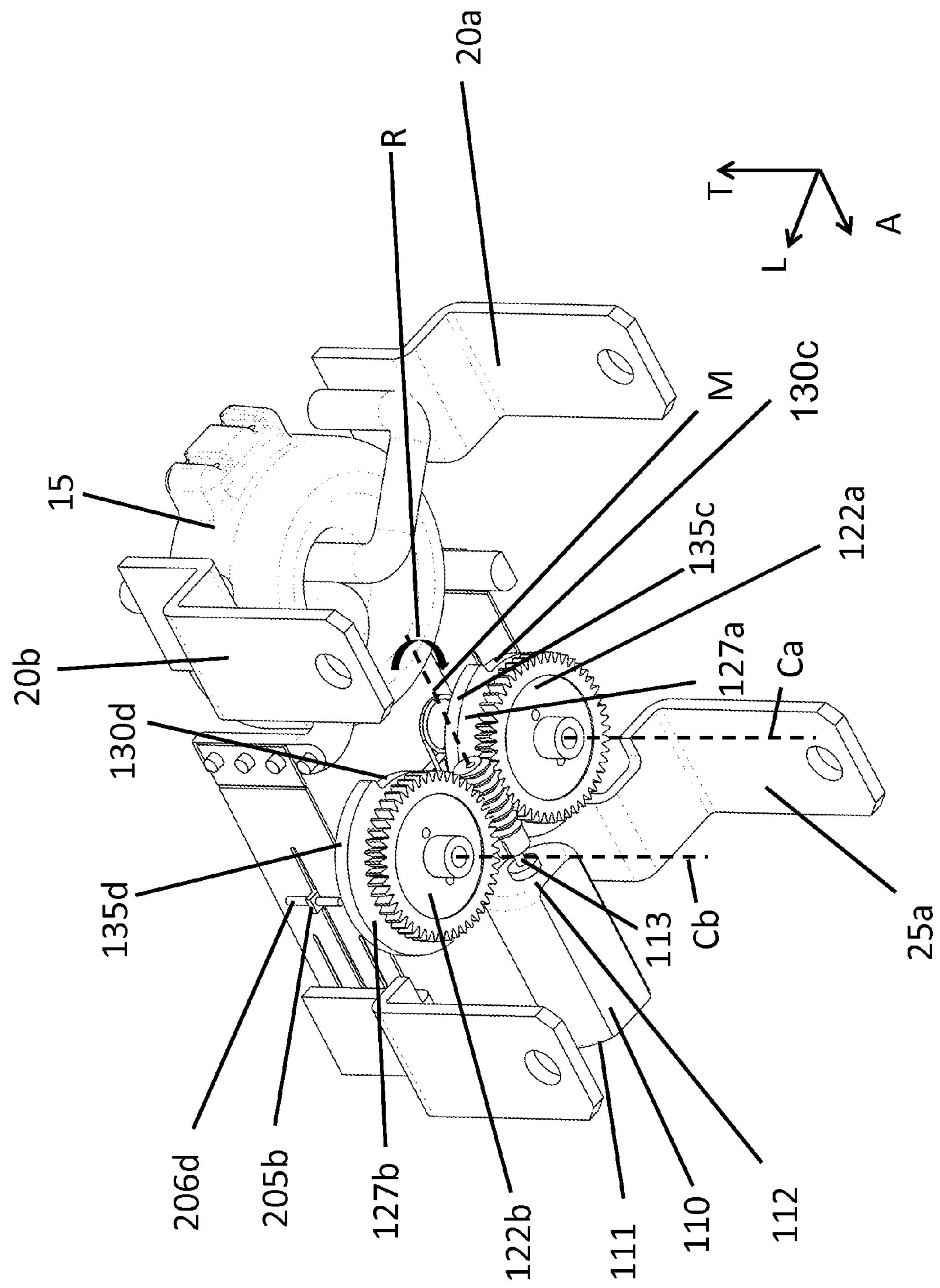
FIG. 6 is a rear perspective view of the embodiment of the single phase watt hour meter shown in FIGS. 1-5 with portions cut away.

In addition to the contact arms 105*a,b* described briefly above, the relay 30 may further include a motor 110 that actuates the contact arms 105 *a,b* to move between the closed position and the opened position. Motor 110 may be a permanent magnet DC motor (brushed or brushless) such as a model FF 050SB sold by Mabuchi of 430 Matsuhidai, Matsudo City, Chiba 270 2280, Japan. Alternatively, motor 110 may be any small electric motor, AC or DC, with or without reduction gearing, including a stepper motor, that will develop sufficient torque to operate the mechanism. In some embodiments, motor 110 may be replaced by other types of actuators. As shown in FIGS. 5 and 6, the motor 110 may be configured to have a front end 111 and an opposing back end 112, the back end 112 supporting a motor output shaft 113. The motor 110 creates a rotational output R that rotates the motor output shaft 113 in a clockwise direction (relative to the perspective of the front end 111 of the motor 110) about an axis M that is parallel to the lateral axis A. Rotational output R drives the rotation of a worm 115 in the clockwise direction (relative to the perspective of the front end 111 of the motor shaft). In alternate embodiments, the relay may be configured so that motor 110 rotates in the counter-clockwise direction.

As shown in the embodiment in FIGS. 5 and 6, worm 115 may be in meshed communication with two worm gears 120*a,b*. Worm gears 120*a,b* may each have a top surface 121*a,b*, and an opposing bottom surface 122 *a,b*, respectively. The top surfaces 121*a,b* may each be fixedly attached to cams 125*a,b*, respectively. Cams 125*a,b* may also have a top surface 126*a,b* and a bottom surface 127*a,b*, respectively. The bottom surfaces 127 *a,b* may be fixedly attached to the top surfaces 121*a,b* of the worm gears 120*a,b*, respectively. As the worm rotates about axis M, worm gears 120*a,b* and cams 125*a,b* are each configured to rotate about axes Ca,b, respectively, that are both parallel to the transverse axis T. Worm gear 120*a* and cam 125*a* may rotate in the counter-clockwise direction relative to the perspective of the top surface 126*a* of the cam 125*a*. Worm gear 120*b* and cam 125*b* may rotate in the clockwise direction relative to the perspective of the top surface 126 *b* of the cam 125*b*. In this way, each of the worm gears 120*a,b* and the cams 125*a,b* may be configured to rotate away from each other (in opposite directions) as the worm 115 (driven by motor 110) rotates.

The embodiment in FIG. 6 provides a bottom perspective view of the relay 30 showing the meshed communication of the worm 115 and the worm gears 120*a,b*. In other embodiments, the configuration of worm 115, worm gears 120*a,b*, and cams 125*a,b* may be modified in a variety of ways. For example, in one embodiment, helical gear teeth may be used. In an alternative embodiment, cams 125*a,b* may have integrally formed teeth that are configured to be in meshed communication with worm 115. In one embodiment, the worm gear 120*a* and cam 125*a* may be molded as a single piece from a plastic resin such as delrin (acetal). In alternative embodiments, worm gear 120*a* and cam 125*a* may be manufactured as separate pieces.

In other alternative embodiments, the gears 115, 120 and cams 125 may be configured to rotate in other directions. In such embodiments, the springs 220 may be anchored in the alternate holes in the cams. In yet another embodiment, the gears 120 may be spur or helical gears sized to be in mesh with each other causing them to rotate in opposite directions synchronously, with the drive motor 110 oriented such that its axis of rotation is parallel to axis C, and the motor output shaft would be fitted with a mating pinion gear in mesh with one of the spur or helical gears to cause it to rotate.

As shown throughout the Figures, the top surfaces 126*a,b* and bottom surfaces 127 *a,b* of the cams 125*a,b* may be identical, or approximately identical in shape. As shown in at least FIGS. 6, 10B, the top and bottom surfaces 126*a,b*, 127*a,b* of each cam 125*a,b* may each be configured to include a small diameter surface 130*a,c,b,d* and a large diameter surface 135*a,c,b,d*. As shown in at least FIG. 9, cams 125*a,b* may also include perimeter edges 145*a,b* connecting the top and bottom surfaces 125*a,b*, 126*a,b*. As shown in at least FIGS. 7-9, each perimeter edge 145*a,b* has a small edge 150*a,b* that corresponds to and connects the small diameter surfaces 130*a,c,b,d* and a large edge 155*a,b* that corresponds to and connects the large diameter surfaces 135*a,c,b,d*. Each perimeter edge 145*a,b* may further include transition edges 160*a,c,b,d* that are positioned between the ends of the small edges 150*a,b*. Cams 125*a,b* may be positioned within the relay 30 such that as the cams rotate about axes Ca,b, a gap G exists between either the small edge 150*a* and the large edge 155*b* or the large edge 155*a* and the small edge 150*b*.

In the embodiments shown in FIGS. 5-9, a linearly actuating member 200 extends lengthwise parallel to the longitudinal axis to connect the two contact arms 105*a,b* at each opposing ends 205*a,b*. Linearly actuating member 200 may be configured to move relative to the load side meter terminals 25*a,b* so that the contact arms 105*a,b* shift between the opened configuration and the closed configuration. Contact arms 105*a,b* may each include a slit 106*a,b* which is configured to mate with the ends 205*a,b* of the actuating member 200 so that the linear actuating member and the contact arms 105*a,b* may be slidably engaged with one another. Linearly actuating member posts 206*a,c,b,d* may be used to slidably secure the linear actuating member 200. Contact arms 105*a,b* may further include hinges 107 *a,b*. Hinges 107*a,b* may be configured so that contact arms 105*a,b* may be fixedly attached to conductors 22*a,b* and slidably attached to linear actuating member 200 to move the relay 30 between the closed and opened positions. Other embodiments may not incorporate hinges 107*a,b* by instead forming the moving contact arms 105 *a,b* of a flexible electrical conductor material, such as a copper alloy.

As described above, contact arms 105*a,b* may further include fingers 108*a,b* that each have movable switch contacts 27*a,b* that mate with fixed switch contacts 26*a,b* (shown in FIG. 10E) on the load side meter terminals 25 *a,b*. In one embodiment, the contacts 26*a,b*, 27*a,b* may be buttons composed of special metal alloys which may be formed as rivets that may be attached to the load side meter terminals 25*a,b* and fingers 108*a,b* of the contact arms 105 *a,b*, respectively. The locations of each of these contacts 26*a,b*, 27*a,b* may be arranged so that they touch each other when contact arms 105*a,b* are in the closed position.

Figure 7:
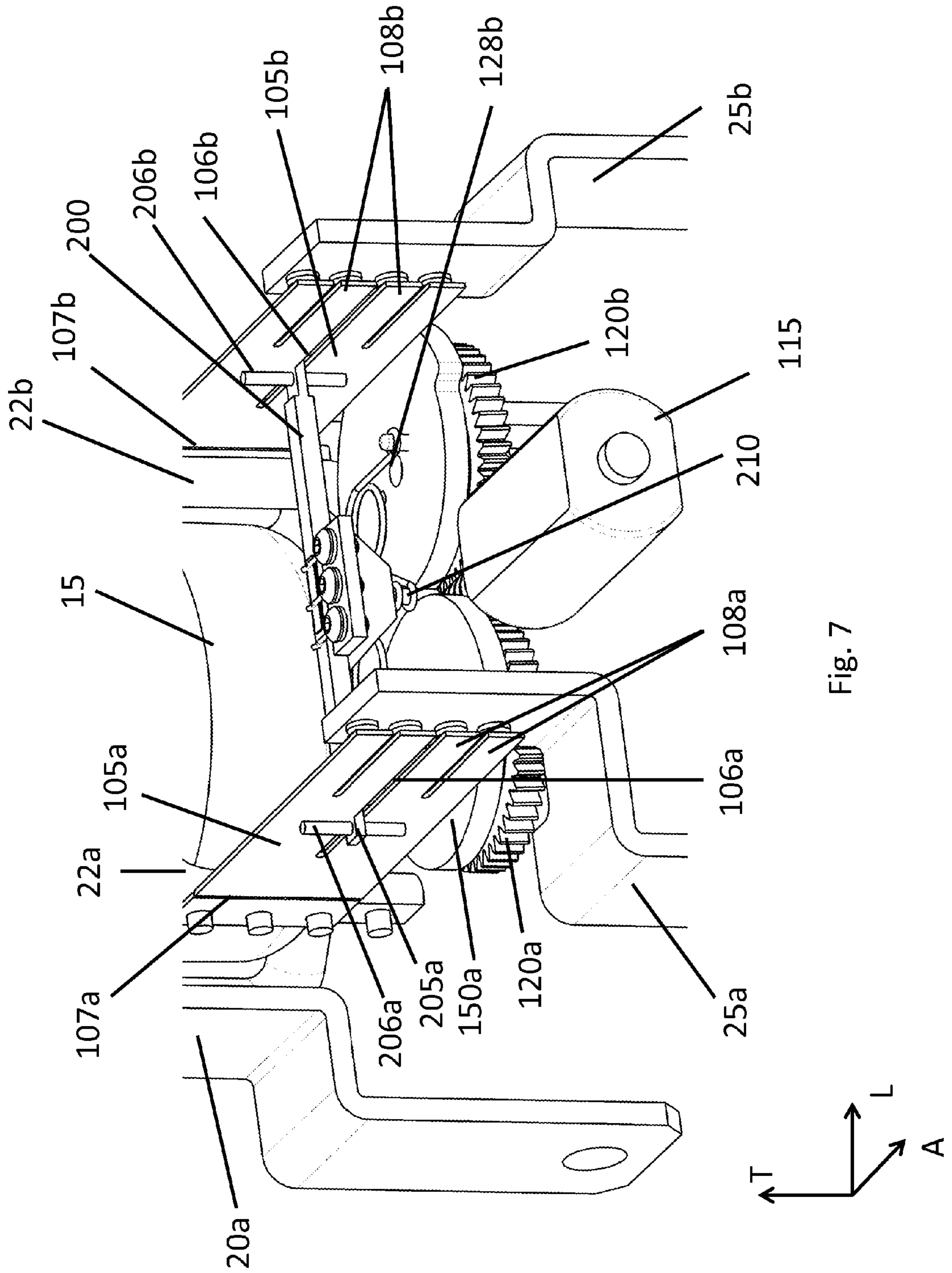
FIG. 7 is a front perspective view of the embodiment of the single phase watt hour meter shown in FIGS. 1-6 with the switch in the closed position with portions cut away.
Figure 8:
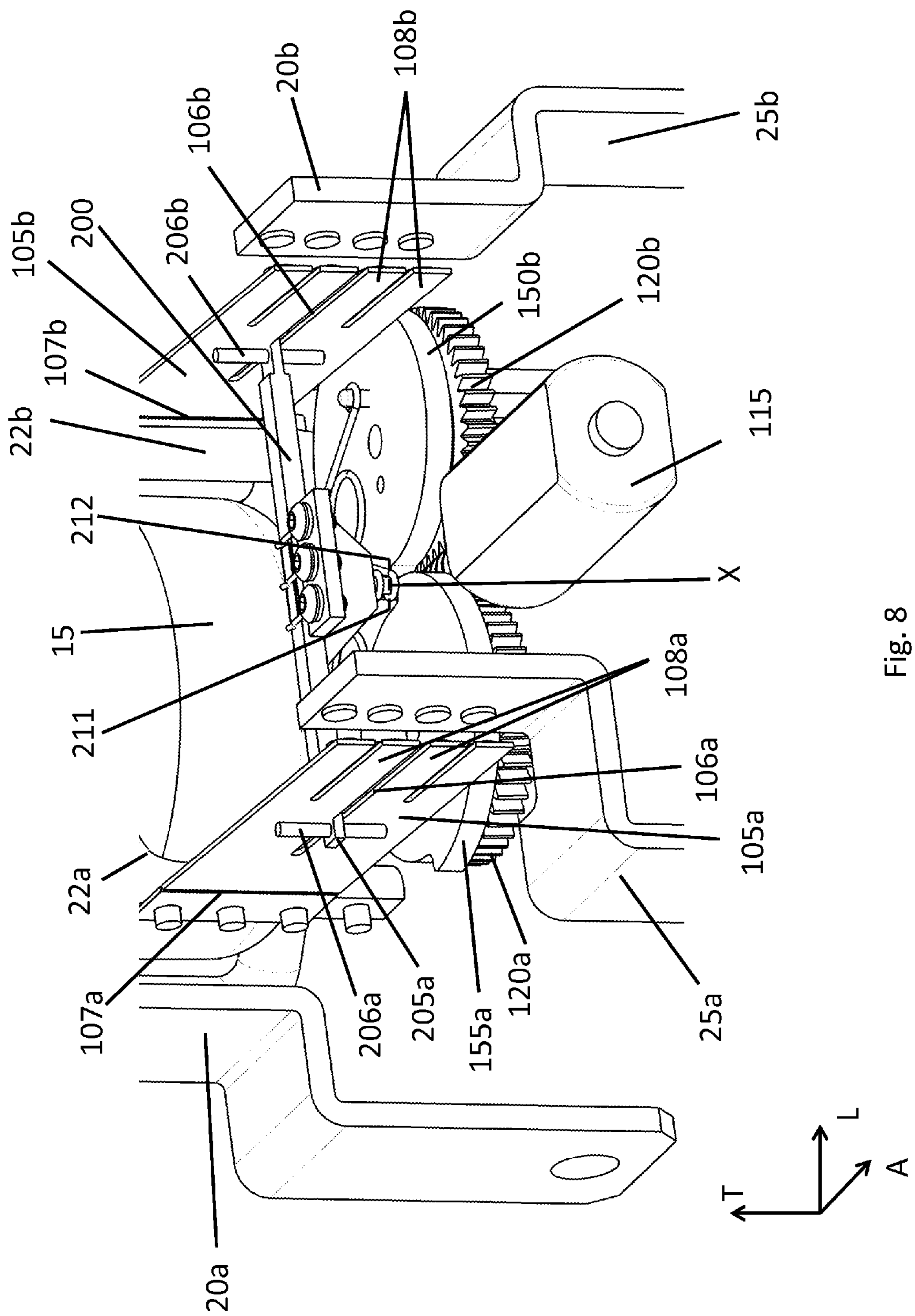
FIG. 8 is a front perspective view of the embodiment of the single phase watt hour meter shown in FIGS. 1-7 as the switch in the process of opening with portions cut away.
Figure 9:
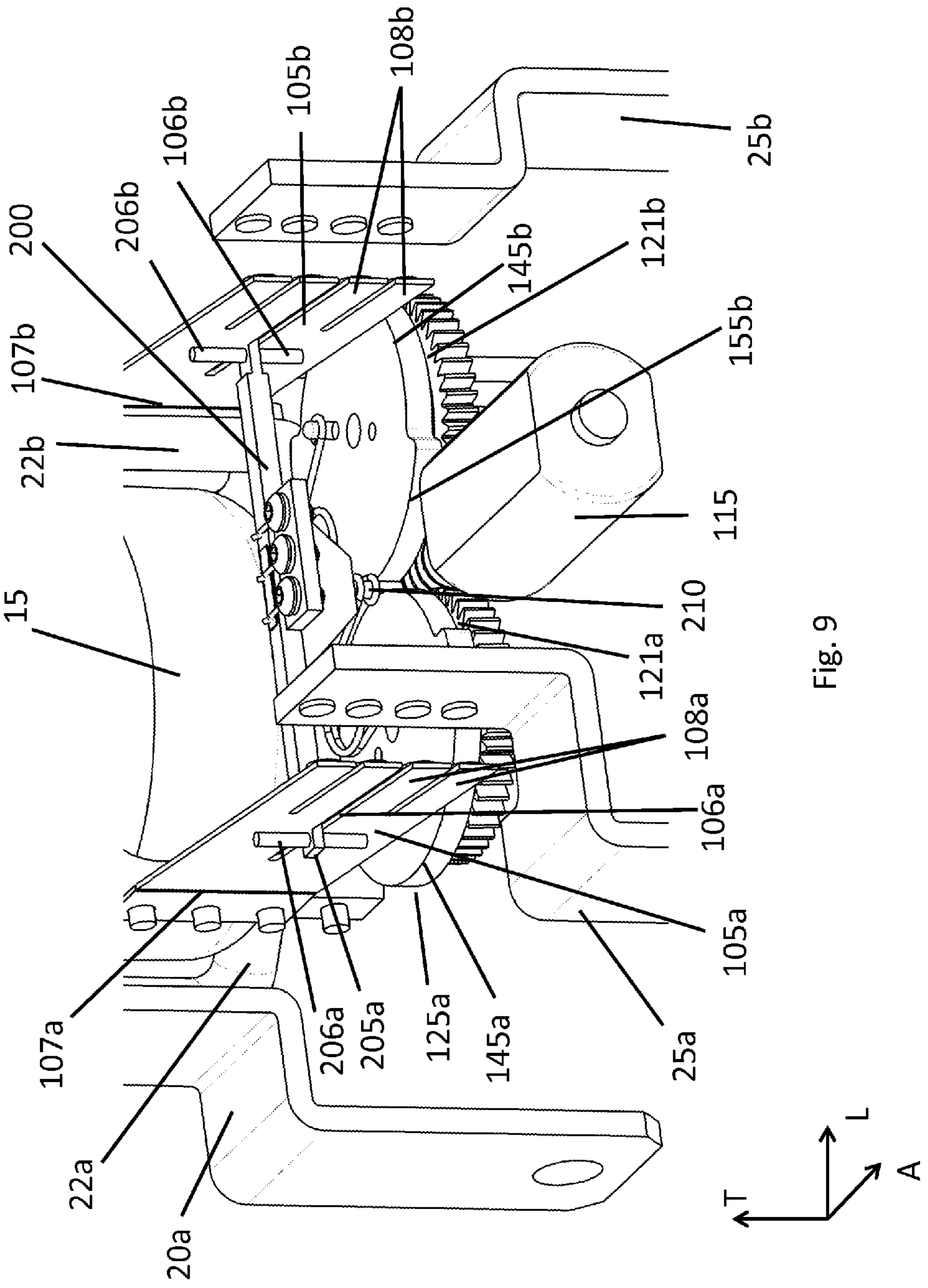
FIG. 9 is a front perspective view of the embodiment of the single phase watt hour meter shown in FIGS. 1-8 with the switch in the opened position with portions cut away.

As shown in FIGS. 7-9, linearly actuating member 200 also extends downward in the transverse direction to a cam follower surface 210 positioned between the perimeter edges 145*a,b* of the two cams 125*a,b*. Cam follower surface 210 may be configured to be slightly smaller than the gap G between either the small edge 150*a* and the large edge 155*b* or the large edge 155*a* and the small edge 150*b*. The cam follower surface 210 may be integrally formed with the linearly actuating member 200. Alternatively, the cam follower surface 200 may be fixedly attached to the linearly actuating member. The cam follower surface may have the shape of a cylindrical pin configured to smoothly reside between the cams 125*a,b*. The cam follower surface 210 may alternatively have other shapes.

In the embodiment shown in FIGS. 3-9, the relative position of the cam follower surface 210 along the perimeter edges 145*a,b* determines whether the relay 30 is opened, closed, or in transition. The cam follower surface may be configured to oscillate along line X which is parallel to the longitudinal axis L as the cams 125*a,b* rotate. Specifically, in the embodiments shown, as the cams 125*a,b* rotate about the axes Ca,b, the cam follower surface rests between either the small edge 150*a* and large edge 155*b*, the large edge 155*a* and the small edge 150*b*, transition edges 160*a,b*, or transition edges 160*c,d*.

For example, in the embodiment shown in FIG. 7, cam follower surface 210 rests between the large edge 155*a* of cam 125*a* and the small edge 150*a* of cam 125*b* so that, relative to the load side meter terminals 25*a,b*, the cam follower surface 210 is shifted right along line X to a right extreme 212. This position of the cam follower surface 210 corresponds to the linearly actuating member 200 and the contact arms 105*a,b* also being shifted right so that the contact arms 105*a,b* are positioned against the load side terminals 25*a,b*, closing the relay and allowing the flow of current. Springs 220*a,b* may be configured so that the forces that cause the cam follower surface 210 to transition from one side to the other when the gap between the cams allow the opportunity to do so.

In the embodiment shown in FIG. 8, the cam follower surface 210 is moving, restraned between transition edges 160*a,b* along line X. When the cam follower surface 210 is in this position, it is in the approximate center of its oscillation path along line X. This corresponds to the linear actuating member 200 and the contact arms 105*a,b* being offset from the load side terminals 25*a,b*. In this configuration, current flow may occur by electrical arc which breaks as soon as the contacts 27*a,b* and 26*a,b* are sufficiently separated. Electrical arcs between the contacts 26*a,b*, 27*a,b* may cause erosion of the surfaces of each, so the relay 30 is configured to minimize the amount of time the relay 30 is in the intermediate configuration. As explained below, in the embodiment shown in FIGS. 3-9, the relay is configured so that the cam follower surface 210 is in this transition position for a mere instant on its way to either the right or left extreme 212, 211 of its oscillation along line X.

In the embodiment shown in FIG. 9, the cam follower surface at the left side or left extreme 211 of its oscillation along line X, with the contact arms 105*a,b* in the fully opened position away from load side terminals 25*a,b*. As shown in FIG. 9, the cam follower surface 210 rests between large edge 155*a* of cam 125*a* and small edge 150*b* of cam 125*b*. With the cam follower surface 210 positioned to at the left extreme 211 of its oscillation, linearly actuating member 200 is also shifted left, bringing contact arms 105*a,b* to the left, as well.

The relay 30 shown in the embodiment of the single phase watt hour meter 10 may also include a pair of springs 220*a,b* that function in conjunction with the motor 110 to move the contact arms 105*a,b* between the opened and closed positions. In the embodiments shown in the figures, springs 220*a,b* may be torsion springs. In other embodiments, other types of springs may be used in place of torsion springs. Some embodiments may alternatively employ other devices with similar functionality to springs.

Springs 220*a,b* may be attached to the cam follower surface 210 and the cams 125*a,b*. In the embodiment shown in FIGS. 3-9, cams 125*a,b* have 3 holes that lie between the small diameter surfaces 130*a,b,c,d* and the large diameter surfaces 135*a,b,c,d*. Central hole 128*a,b* is configured to lie in the center or approximate center of the cam 125*a,b* such that the center of the central hole 128*a,b* is on axis Ca,b about which the cam 125*a,b* rotates. Outer holes 129*a,c,b,d* are each located radially outward from axes Ca,b along a line Q defined by where the small diameter surfaces 130*a,b* converge with the large diameter surfaces 135*a,b*. The outer holes 129*a,b* and 129*c,d* on each cam 125*a,b* are each located in opposing directions, respectively, along line Q at equal or approximately equal distances from axes Ca,b.

Figure 10A:
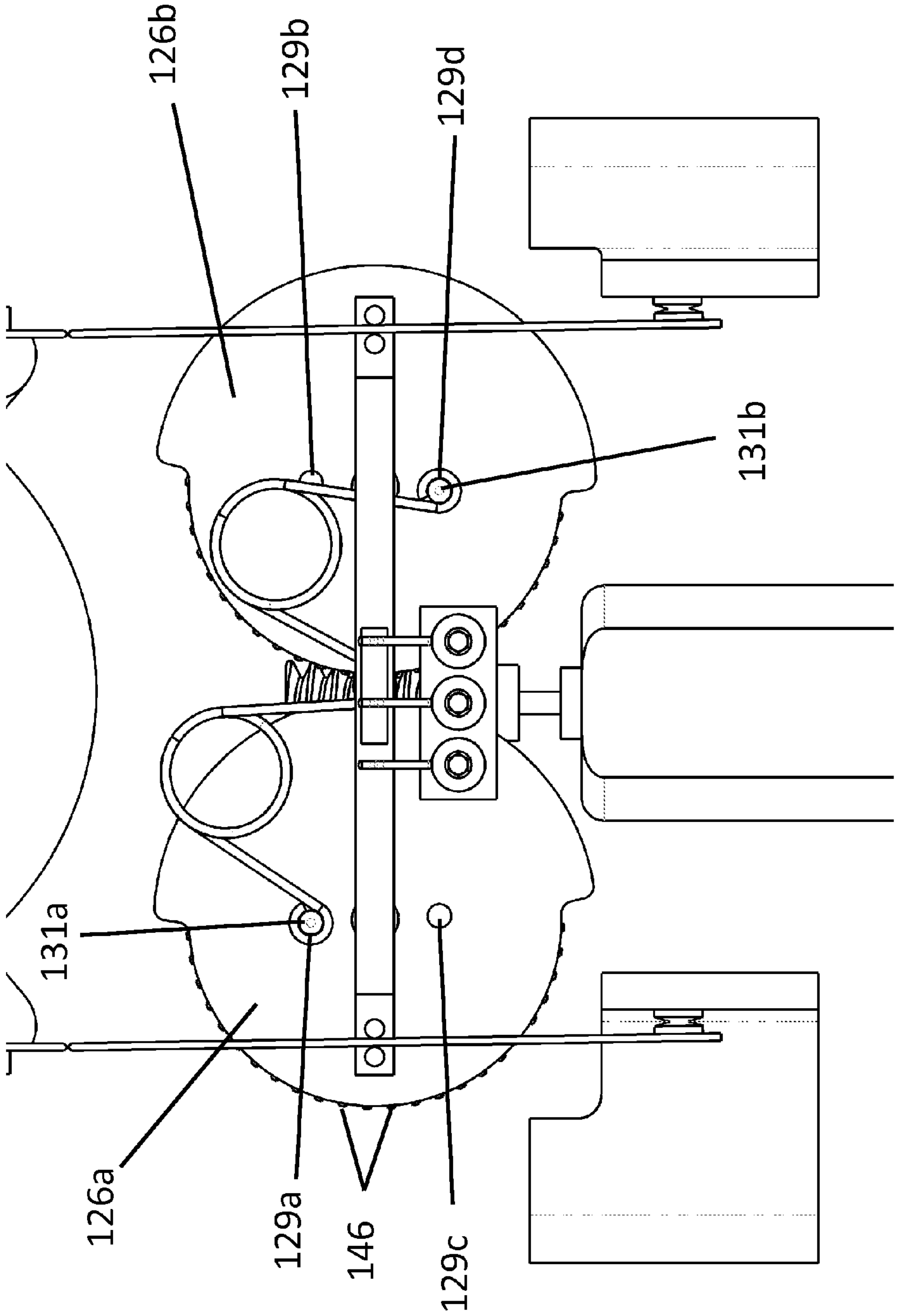
FIGS. 10A-J are top planar views of one embodiment of a relay showing the positions of the cam and springs as the relay opens and closes.
Figure 10B:
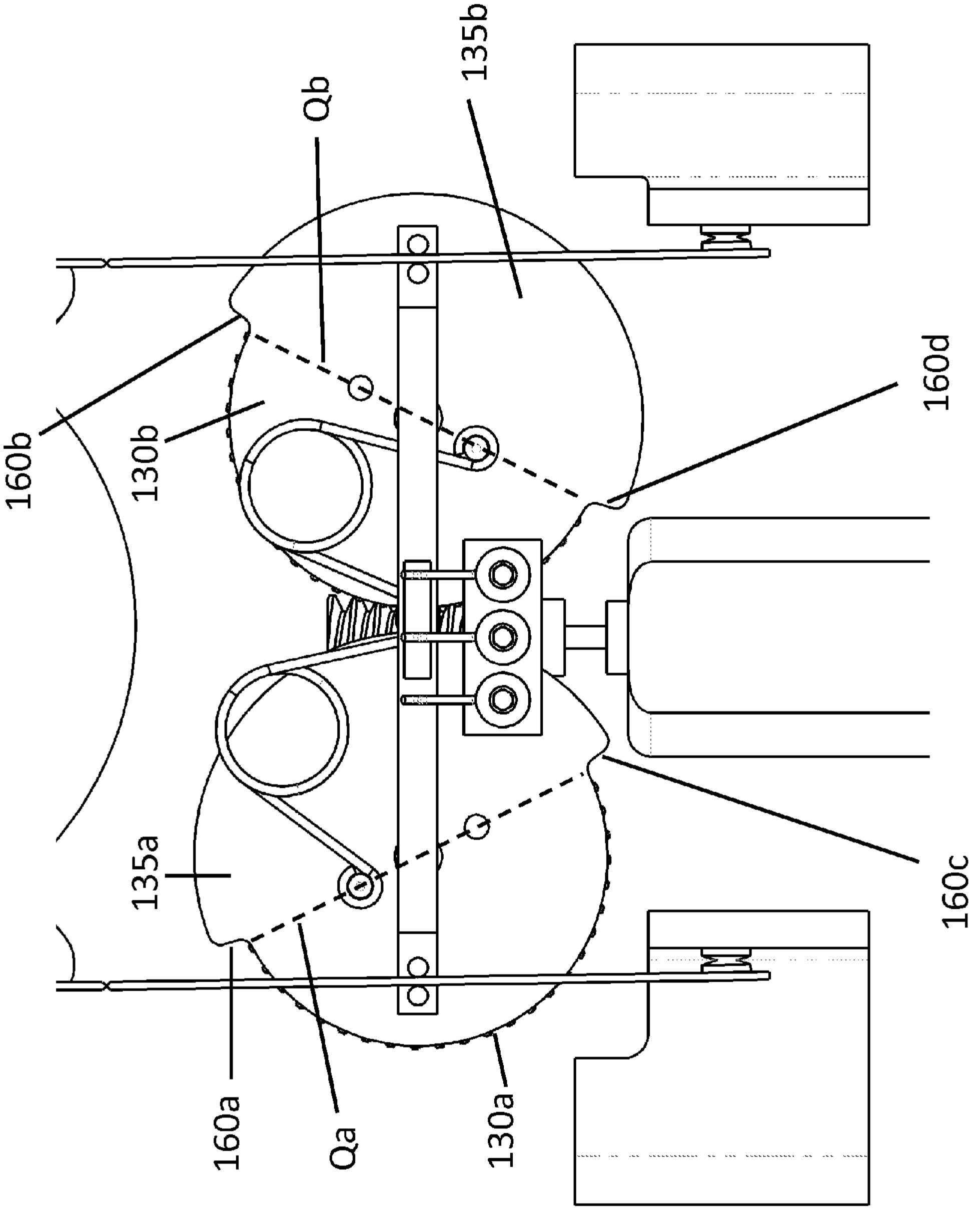
Figure 10C:
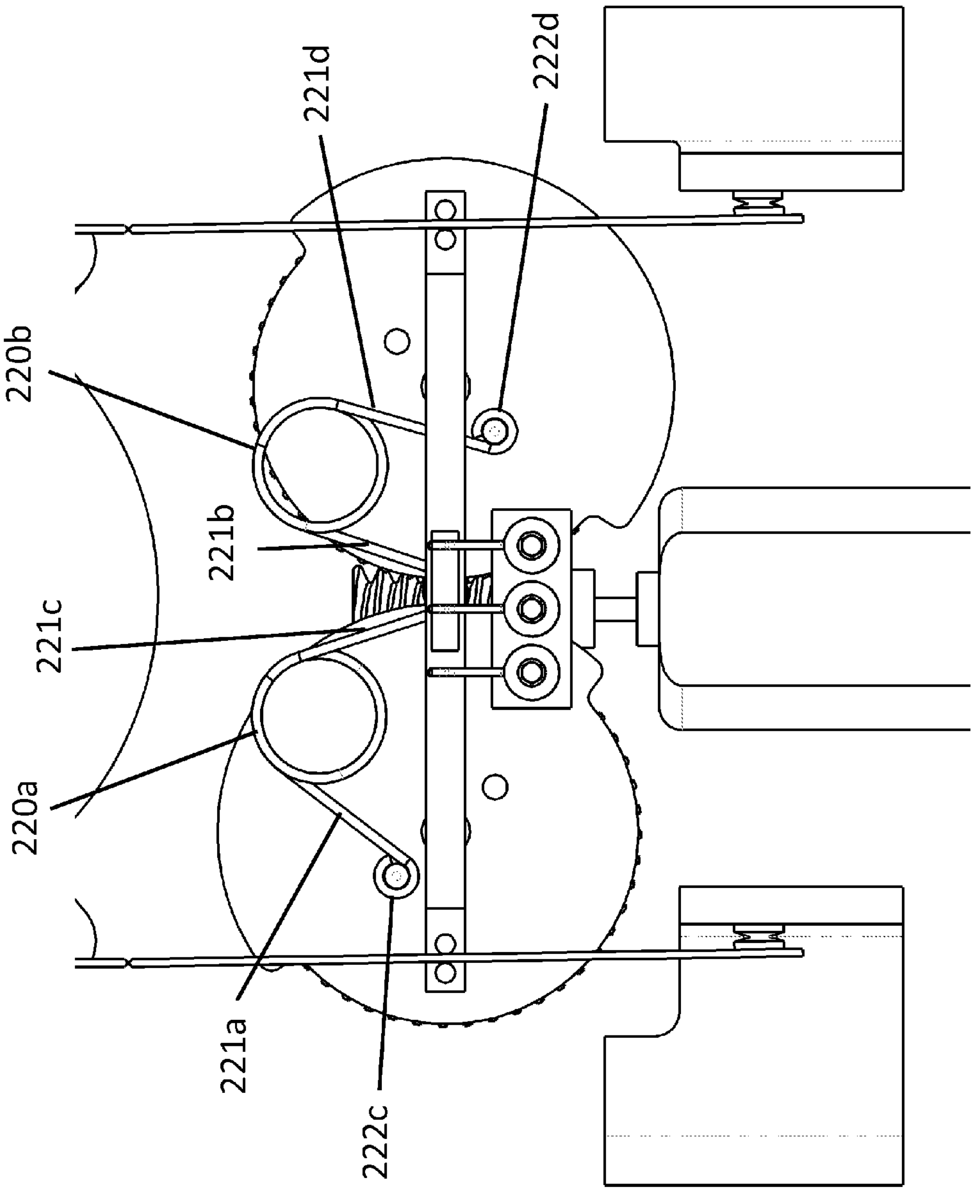

As shown in FIG. 10C, springs 220*a,b* have anchor loops 222*a,c,b,d* at the ends of legs 221*a,c,b,d* for linking the cam follower surface 210 and the cams 125*a,b*. Anchor loops 222*a,b* may be configured to wrap around the cam follower surface 210 as shown in FIGS. 7-9. Anchor loops 222*c,d* may similarly wrap around cam posts 131*a,b* which may be secured in outer holes 129*a,d*, respectively. The embodiment shown includes outer holes 129*c,b* so that each cam 125*a,b* is identical and formed from the same process. In other embodiments, cams 125*a,b* may not include outer holes 129*c,b*. Some other alternative embodiments may use different methods of attaching the springs 220*a,b* to the cams 125*a,b* such as welding or heading a plastic stud molded as part of the cam.

While the embodiment shown in FIGS. 3-9 depicts a relay 30 used in a single phase watt hour meter 10, relay 30 may be used in a variety of applications. For example, relay 30 may be used with any small to medium, as well as some large electrical switch contacts such as battery management in an electric vehicle. Another example where relay 30 may be used is any application requiring a latching relay, such as a signal or power routing applications. FIGS. 10A-J show a relay 30 that can be used in a variety of applications, including the single phase watt hour meter 10 as shown in FIGS. 3-9. The embodiment of the relay 30 used in FIGS. 3-9 is interchangeable with the embodiments shown in FIGS. 10A-J and 11. For this reason, the same reference numerals are used throughout the embodiments shown. The use of the same reference numerals is for the purpose of more clearly describing all of the parts of the relay 30 and is not intended to in any way limit the applications of the relay 30, which may be used in many other types of applications in addition to the watt hour meters 10, 13 shown.

FIGS. 10A-J show the progression of an embodiment of the relay 30 as contact arms 105*a,b* move from the closed to opened to closed configurations. In the embodiments shown throughout the Figures, relay 30 is a bistable relay. Bistable relays have two relaxed states such that when the relay 30 is actuated to its closed or opened position, it remains in that configuration until actuated again. FIG. 10A depicts the relay 30 is in the closed position with the legs 221*a,c,b,d* of the springs 220*a,b* in approximately neutral positions. In other words, the springs 220*a,b* as shown in FIG. 10A have minimal or no potential energy. Cams 125*a,b* are positioned so that large diameter 155*a* is positioned against the cam follower surface 210 which is in turn positioned against small diameter 150*b*. In this way, cam follower surface 210 is at the right extreme 212 of its oscillation along line X.

FIG. 10B shows the continuing rotation of cams 125*a,b* in opposing directions so that the legs 221*a,c* of spring 220*a* are beginning to expand and legs 221*b,d* of spring 220*b* are beginning to compress. In this way, potential energy is increasing in both springs 220*a,b*. The relay 30 is still in the closed position because cam follower surface 210 is still situated between the large diameter 155*a* of cam 125*a* and the small diameter 150*b* of cam 125*b*.

FIG. 10C shows the cams 125*a,b* rotated further about axis Ca,b. Legs 221*a,c* of spring 220*a* are further extended and legs 221*b,d* of spring 220*b* are further compressed. The potential energies in both springs 220*a,b* are building to maximized levels based on the configuration of the relay 30.

Figure 10D:
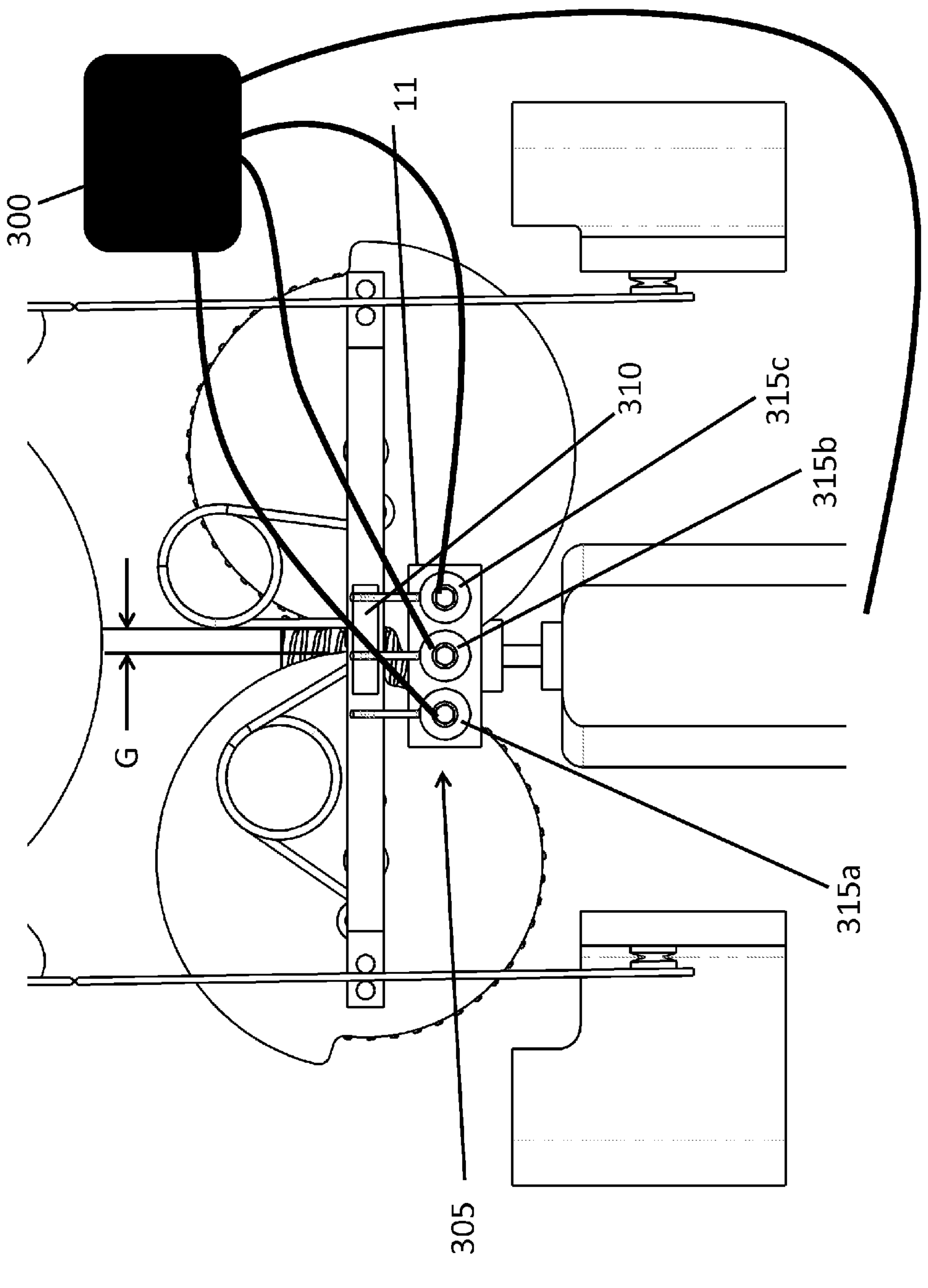

FIG. 10D shows springs 220*a,b* configured so that their potential energies are maximized, the instant before the relay 30 switches to the opened configuration. Legs 221*a,c* of spring 220*a* are fully extended and legs 221*b,d* of spring 220*b* are fully compressed so that cam follower surface 210 is pressed against the perimeter edge 145*a* of cam 125*a*. Cam follower surface 210 moves along the perimeter edges 145*a,b* to the transition edges 160*c,d*. When the cam follower surface 210 reaches the transition edges 160*c,d*, the extended legs 221*a,c* of spring 220*a* quickly compress as compressed legs 221*b,d* of spring 220*b* quickly expand, shifting cam follower surface 210 to the left extreme 211 of its oscillation along line X. In the embodiment shown, since the cam follower surface 210 is fixedly attached or integrally formed with the linearly actuating member 200, the shift of the cam follower surface to the left also shifts the linearly actuating member to the left. As described above, linearly actuating member 200 is slidably attached to the contact arms 105*a,b* so that shifting the linearly actuating member may result in moving the contact arms 105*a,b*. In the embodiment shown, as the linearly actuating member 200 shifts to the left extreme 211, the contact arms 105*a,b* swing away from the load side terminals, and the relay opens.

Figure 10E:
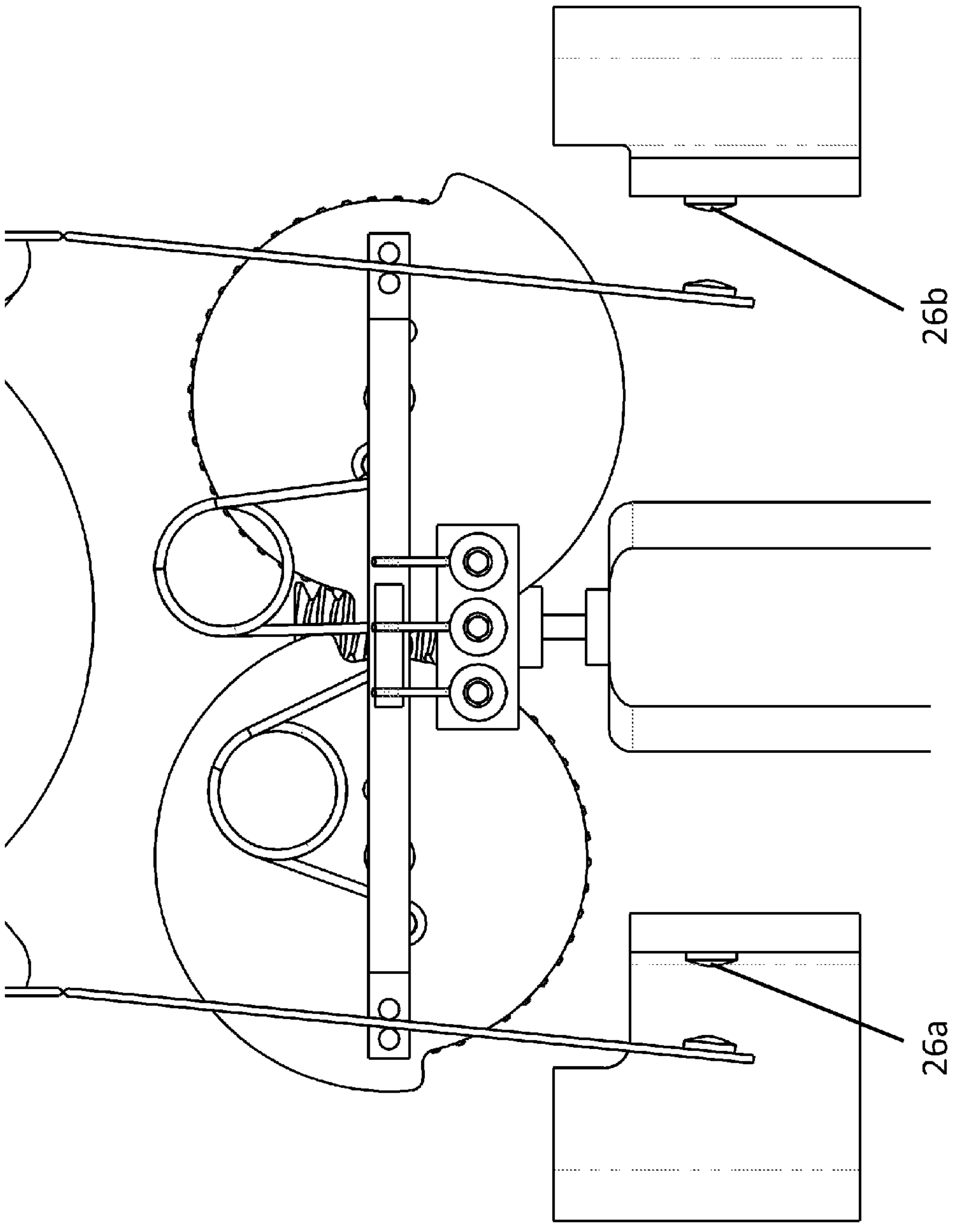
Figure 10F:
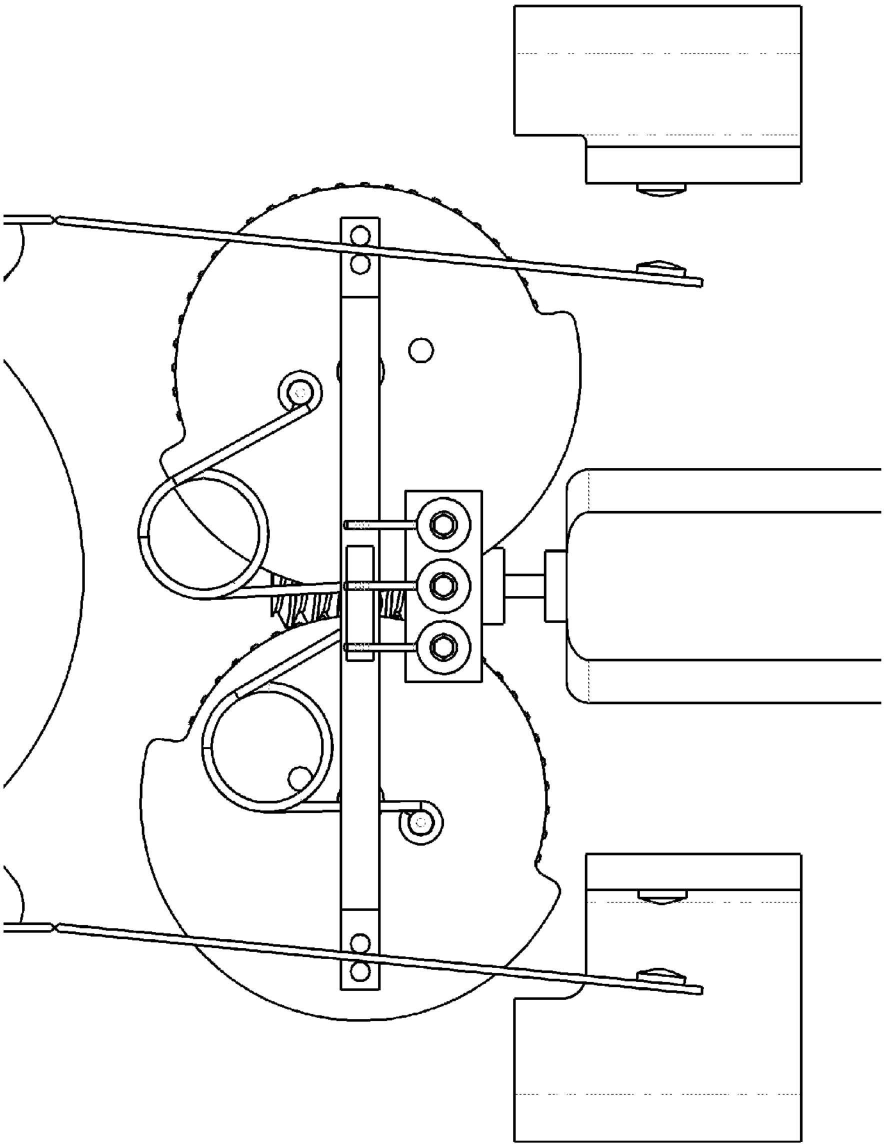

FIG. 10E shows the relay 30 with the contact arms 105*a,b* in the open position as the springs 220*a,b* continue to release their potential energy. In the embodiment shown, the gears stop rotating when the motor coasts to a stop after power is removed by the control system. When the worm 115 stops rotating, worm gears 120*a,b* are locked in position and the springs 220*a,b* remain in their corresponding positions. In FIG. 10F, the springs 220*a,b* are again at a neutral or close to neutral position such that the springs 220*a,b* are each putting approximately equal force on the cam follower surface 210.

Figure 10G:
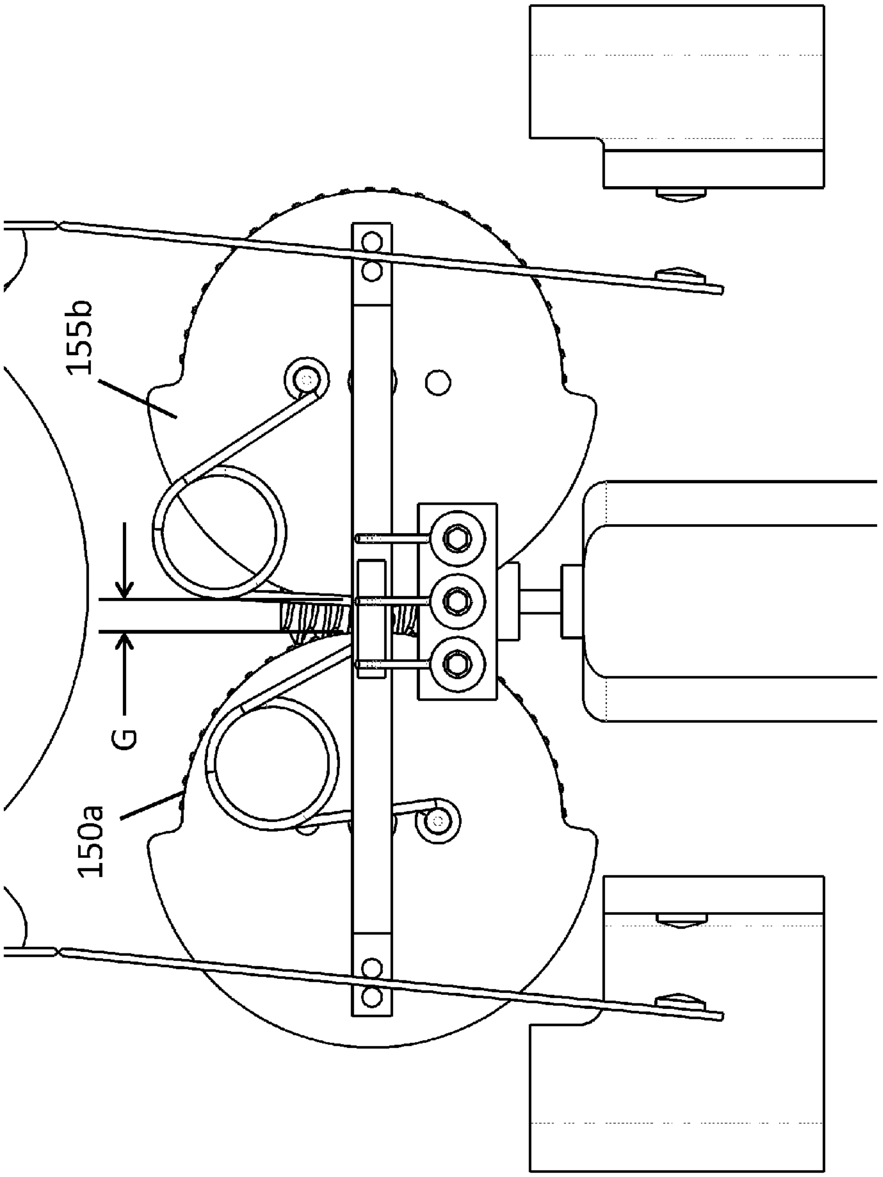
Figure 10H:
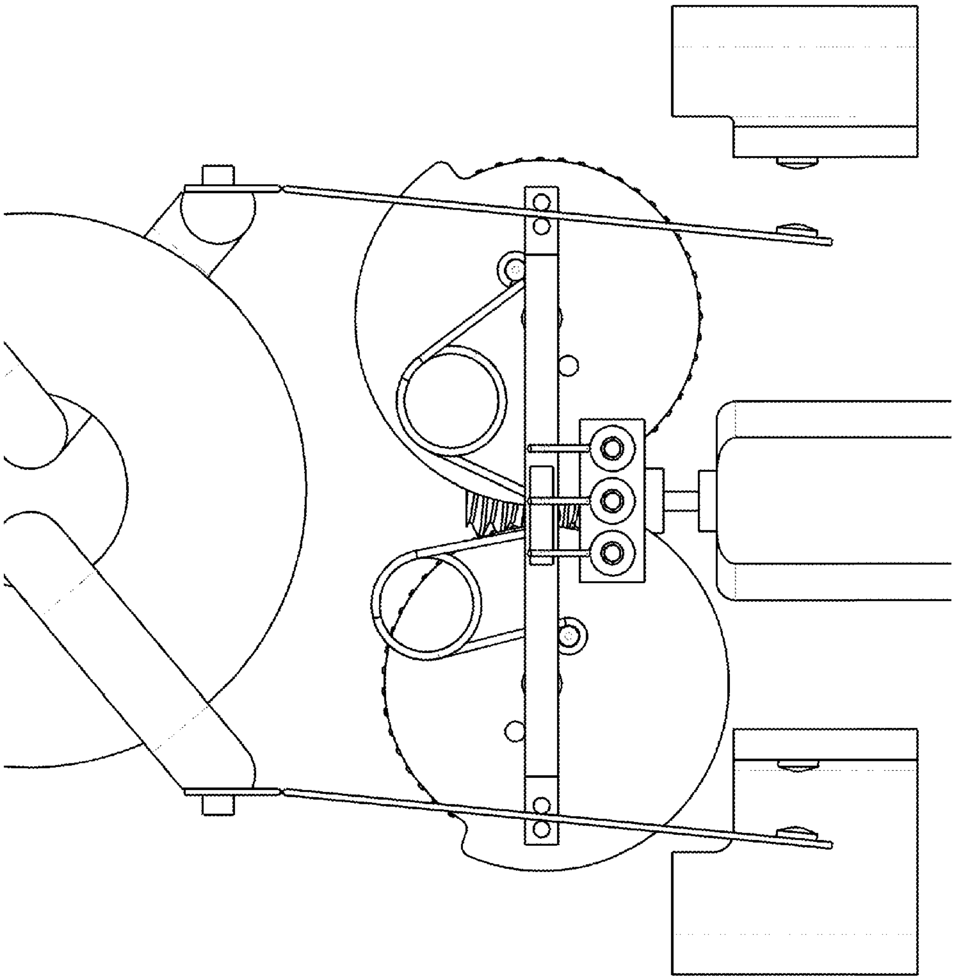
Figure 10I:
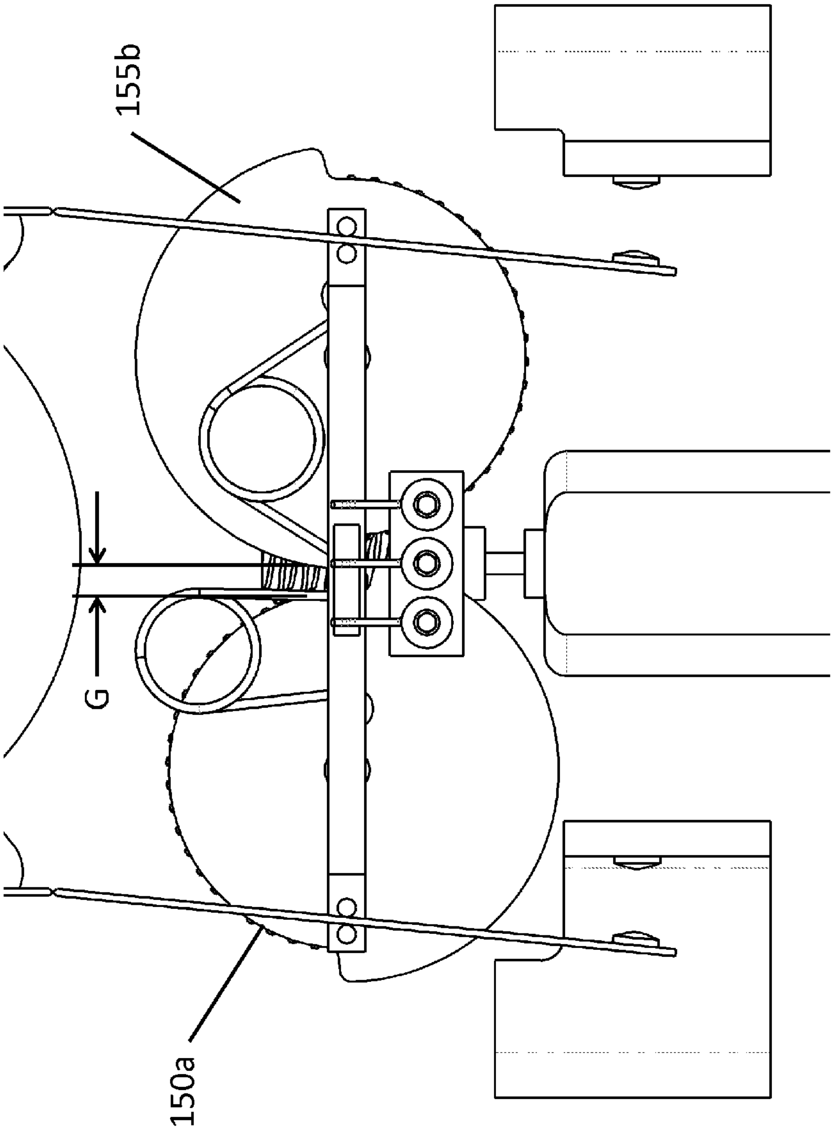
Figure 10J:
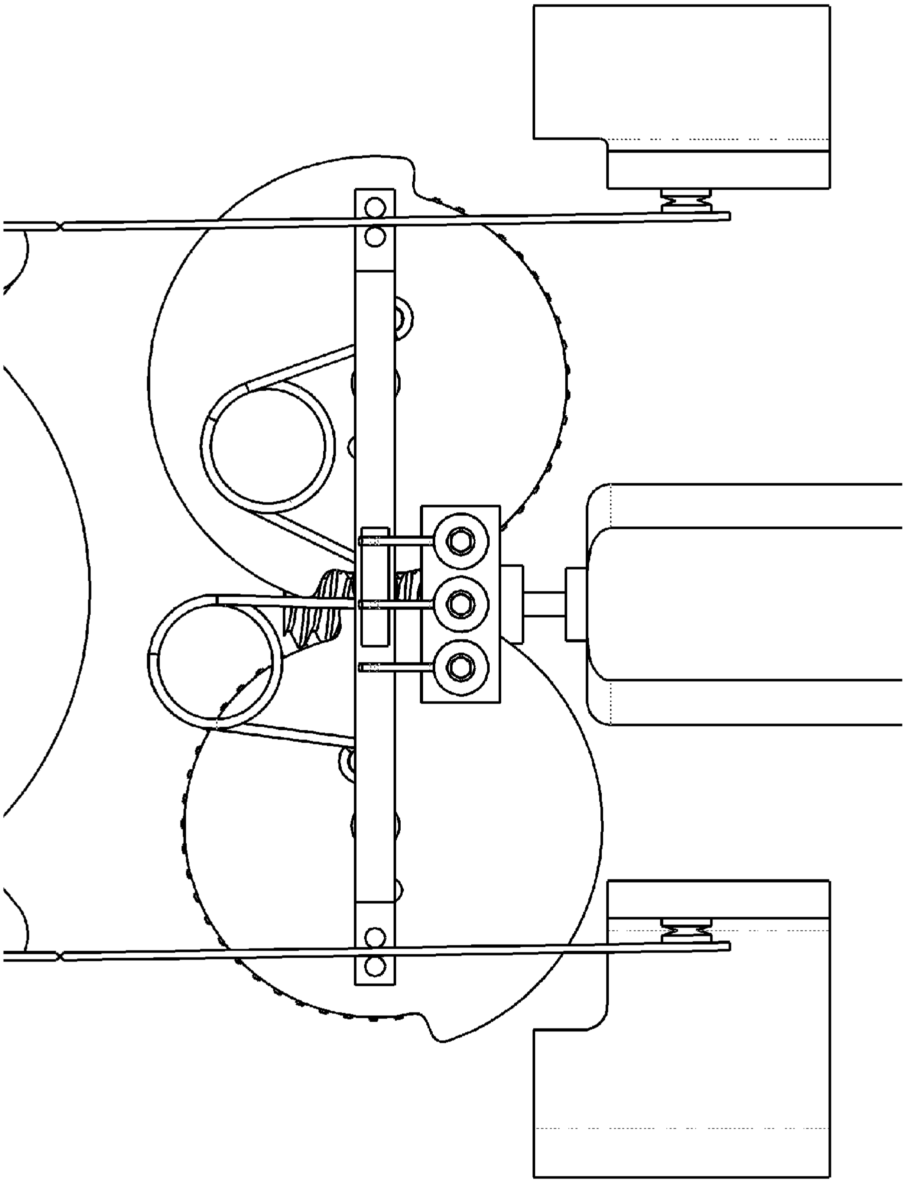
Figure 11:
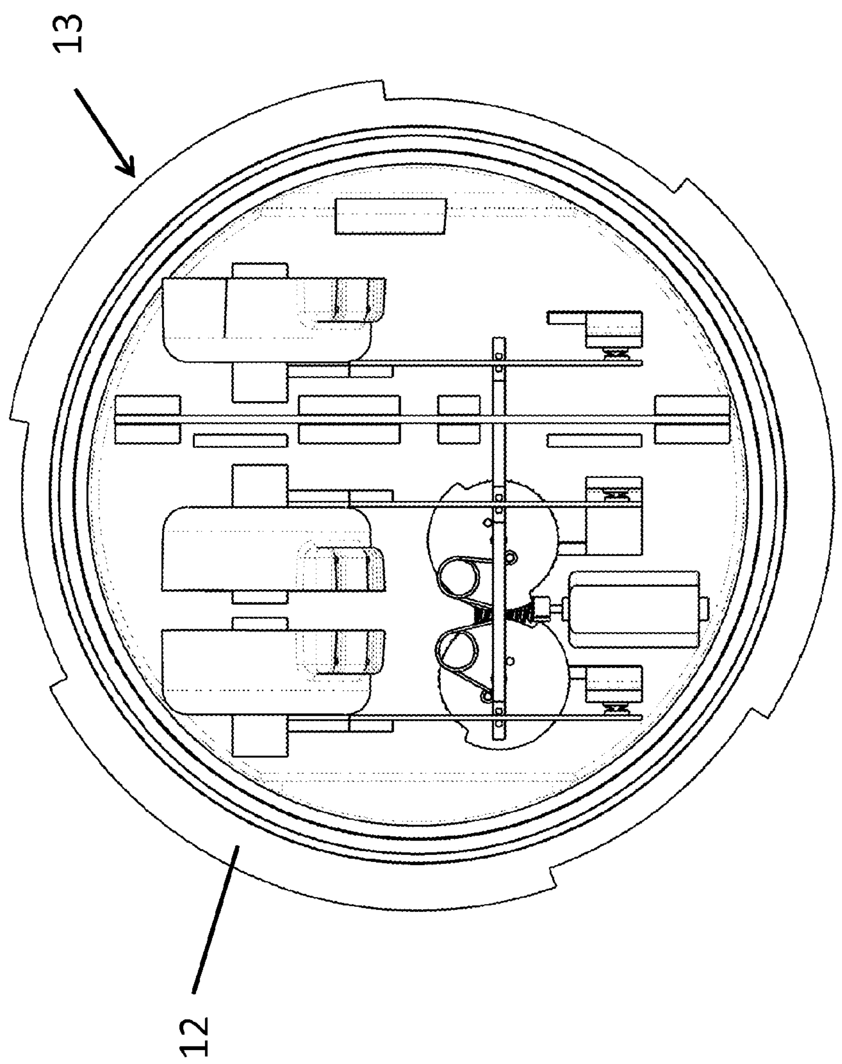
FIG. 11 is a top planar view of an embodiment of the three phase watt hour meter.

In FIGS. 10G,H, the motor 110 rotates cams 125*a,b* to again build potential energy in the springs 220*a,b* as legs 221*a,c* of spring 220*a* begin to compress and legs 221*b,d* of spring 220*b* begin to expand. Contact arms 105*a,b* remain in the open position. FIG. 10I shows the relay 30 in the instant before the contact arms 105*a,b* close. When the cam follower surface 210 reaches the transition edges 160*a,b*, as shown in FIG. 10J, the extended legs 221*b,d* of spring 220*b* quickly compress as compressed legs 221*a,c* of spring 220*a* quickly expand, shifting cam follower surface 210 to the right extreme 212 of its oscillation along line X. The shift of the cam follower surface 210 causes the linearly actuating member 200 to also shift, in turn bringing the contact arms 105*a,b* against the load side terminals 25*a,b* so that the relay 30 is closed.

While the embodiment shown in FIGS. 10A-J has described relay 30 as including a pair of worm gears 120*a,b*, a pair of cams 125*a,b*, and a pair of springs 220*a,b*, other embodiments employ the use of a single gear, cam, or spring. In yet other embodiments, a single gear 120 may be used in conjunction with a single cam 125 and a single spring 220. In these alternative embodiments, a single spring 220 may be configured to provide a biasing force against a cam 125 being rotated by gear 120. Other embodiments in which a cam is driven from the center by mounting it on the output shaft of a gearmotor are also contemplated.

Actuation of the motor 110 may be controlled by a control system 300 that powers the motor 110 on and off depending on the configuration of the relay. In the embodiment shown in FIGS. 10A-J, the control system may include a single pole double throw type control switch 305. The control switch 305 may include a metal plate 310 on the linearly actuating member 200. In one embodiment, conductive plate 310 may be fixedly attached or mounted onto the linearly actuating member 200. Alternatively, conductive plate 310 may be integrally formed with the linearly actuating member 200. The control switch 305 may further include three spring type conductive metal electrodes 315*a,b,c* mounted on a fixed insulated base 11, with electrodes 315*a,c* connected to the control system and electrode 315*b* connected to the motor. In one embodiment, the fixed insulated base 11 may be part of a housing 12 (shown in FIGS. 1 and 11) such as a housing for a watt hour meter 10, 13.

In one embodiment, the center electrode 315*b* is wired to the motor 110 such that center electrode 315*b* is configured to be energized by conductive plate 310. In some embodiments, the control system 300 response to a command transmitted to the relay 30 remotely by radio communication or other communication technology such as a power line carrier or locally initiated by an optical port or control switch on the meter. At the time the meter received a command to change the switch configuration, or open or closed state, the control system will energize either electrode 315*a* or 315*c*, which will indirectly energize the motor through the conductive plate 310 and electrode 315*b*. When the relay state changes, the connection to the energized electrode is broken and the motor stops. There is no feedback signal from the electrodes to the control system. The control system is configured to energize electrode 315*a* to close the contacts, and energize 315*c* to open the contacts. For example, as shown in FIG. 10D, the contacts are closed, so to open the contacts, the control system would energize 315*c*. If 315*a* were energized, there would be no effect because 315*a* is not in contact with the conductive plate 310. When, conductive plate 310 is energized by either left electrode 315*a* or right electrode 315*c*, depending on the position of the linearly actuating member 200 (which corresponds to the positions of the contact arms 105*a,b* and whether the relay is opened or closed). In the configuration shown in FIG. 10D, the linearly actuating member 200 is shifted right so that the conductive plate 310 sits in direct contact with right electrode 315*c* and right electrode 315*c* is energized. In order to open the relay 30, the control system 300 energizes electrode 315*c*, which in turn energized the conductive plate 310 which energizes the center electrode 315*b*, which is connected to the motor, causing the motor to run. As the motor runs, mechanical energy is stored in the springs 220, and the springs will cause the linear output bar to shift when the cams allow. When the linear output bar shifts, opening the contacts, the conductive plate 310 is no longer energized through electrode 315*c*, causing the motor to stop. As shown in FIGS. 10A-10E, and described above, the motor 110 and springs 220*a,b* work in conjunction to shift the linearly actuating member 200 (and the conductive plate 310) from right to left. As described above, when the linearly actuating member 200 shifts, it also shifts the contact arms 105*a,b* moving them to either the closed or opened position. When the conductive plate 310 on the linearly actuating member 200 shifts (as shown in FIG. 10E), right electrode 315*c* is no longer touching the conductive plate 310, interrupting the electrical current flow to the motor causing it to stop. Left electrode 315*a* becomes in contact with the conductive plate 310, allowing it to energize the conductive plate 310 when the control system energizes the electrode 315*a*.

Control system 300 may work in a similar manner to control the closing of the relay 30. As shown in FIG. 10E, conductive plate 310 is configured to sit under left electrode 315*a* when the relay is opened. Accordingly, when a signal is sent to the control system 300 to control system 300. As shown in FIGS. 10E-10J, and described above, the motor and springs 220*a,b* work in conjunction to shift the linearly actuating member (and the conductive plate 310) from left to right in order to shift the contact arms 105 *a,b* and close the relay. When the conductive plate shifts (as shown in FIG. 10J), left electrode 315*a* may still be energized but the conductive plate 310 is no longer energized. Since the motor 110 is indirectly connected to the conductive plate through electrode 315*b*, the motor will stop even if the electrode 315*a* is still energized While control system 300 has been described in relation to the employment of a single pole double throw electrical switch, other embodiments use different methods of control. For example, in some embodiments, control system 300 may use an optical sensor. In other embodiments, a single pole double throw electrical switch may be used, but in another location along the linearly actuating member 200.

A method of controlling the flow of current through the relay 30 is also contemplated. Such a method may include a step of actuating a motor so as to effect rotation of a pair of cams and an increase in potential energy of two springs attached to the cams, wherein the springs are both attached to a cam follower surface resting between the cams, the cam follower surface being attached to a linear actuating member that controls the motion of a pair of contact arms 105*a,b*. The method may further include stopping the motor when the cam follower surface shifts from a first position to a second position, such that when the cam follower surface is in the first position, current flows through the relay and when the cam follower surface is in a second position, current does not flow through the relay.

In alternative embodiments, the relay 30 may be a bistable relay. Further, some embodiments may include a method wherein the motor is controlled by a control system 300. This control system 300 may include a single pole double throw type control switch 305.

While certain embodiments have been described above, it is understood that modifications and variations may be made without departing from the principles described above and set forth in the following claims. Accordingly, reference should be made to the following claims as describing the scope of the present invention.

What is claimed:

1. A watt hour meter comprising
- a meter current sensor;
- a plurality of meter terminals, including a first set of meter terminals and a second set of meter terminals; and
- a bistable relay having a closed configuration and an opened configuration, the bistable relay further comprising:
  - a pair of contacts, each having a first position associated with the closed configuration of the relay and a second configuration associated with the open configuration of the relay;
  - a motor;
  - a pair of springs;
  - a pair of cams driven by the motor; and
  - a linearly actuating member configured to move the contacts from the first position to the second position and from the second position to the first position, the member including a cam follower surface.

2. The watt hour meter of claim 1 wherein the first set of meter terminals is configured to connect to a source side and the second set of meter terminals is configured to connect to a load side.

3. The watt hour meter of claim 1 wherein the watt hour meter is a single phase watt hour meter.

4. The watt hour meter of claim 1 wherein the watt hour meter is a polyphase watt hour meter.

5. The watt hour meter of claim 1 wherein the motor is controlled by a control system.

6. The watt hour meter of claim 5 wherein the control system comprises a single pole double throw type control switch.

7. A relay having an opened position and a closed position, the relay further comprising:
- a pair of contact arms, each having a first end and a second end, such that, when the relay is in the closed position, current flows from the first end to the second ends of each of the contact arms, and when the relay is in an open position, current does not flow from the first ends to the second ends of the contact arms;
- a motor;
- a pair of springs;
- a pair of cams driven by the motor; and
- a linearly actuating member connected to the contact arms and configured to move the contact arms from the first configuration to the second configuration, the member including a cam follower surface.

8. The relay of claim 7 wherein the relay is a bistable relay.

9. The relay of claim 7 wherein the motor is controlled by a control system.

10. The relay of claim 9 wherein the control system comprises a single pole double throw type control switch.

11. A relay having an open position and a closed position, the relay further comprising:
- a pair of contact arms, each having a first end and a second end, such that, when the relay is in the closed position, current flows from the first end to the second ends of each of the contact arms, and when the relay is in an open position, current does not flow from the first ends to the second ends of the contact arms;

a motor;

a pair of springs;

a pair of cams driven by the motor; and a linearly actuating member connected to the contact arms and configured to move the contact arms from the first configuration to the second configuration, the member including a cam follower surface.

12. The relay of claim 11 wherein the motor is controlled by a control system.

13. The relay of claim 12 wherein the control system comprises a single pole double throw type control switch.

14. The relay of claim 11 wherein the relay is a bistable relay.

15. A method of controlling the flow of current through a relay comprising:

actuating a motor so as to effect rotation of a pair of cams and an increase in potential energy of two springs attached to the cams, wherein the springs are both attached to a cam follower surface resting between the cams, the cam follower surface being attached to a linear actuating member that controls the motion of a pair of contacts;

stopping the motor when the cam follower surface shifts from a first position to a second position, such that when the cam follower surface is in the first position, current flows through the relay and when the cam follower surface is in a second position, current does not flow through the relay.

16. The method of claim 15 wherein the motor is controlled by a control system.

17. The method claim 16 wherein the control system comprises a single pole double throw type control switch.

18. The method of claim 15 wherein the relay is a bistable relay.

* * * * *